(12) United States Patent
Jimenez De Parga Bernal et al.

(10) Patent No.: US 9,203,473 B1
(45) Date of Patent: Dec. 1, 2015

(54) METHOD AND APPARATUS FOR SEPARATING POWER LINE COMMUNICATION (PLC) SIGNALS FROM MAINS ELECTRICITY

(71) Applicant: Marvell International Ltd., Hamilton (BM)

(72) Inventors: Antonio Jimenez De Parga Bernal, Rocafort (ES); Jose Luis Gonzalez Moreno, Xirivella (ES)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/612,788

(22) Filed: Feb. 3, 2015

Related U.S. Application Data

(60) Provisional application No. 61/936,809, filed on Feb. 6, 2014.

(51) Int. Cl.
*H04B 3/00* (2006.01)
*H04L 25/00* (2006.01)
*H04B 3/54* (2006.01)
*H03H 7/00* (2006.01)

(52) U.S. Cl.
CPC . *H04B 3/54* (2013.01); *H03H 7/004* (2013.01)

(58) Field of Classification Search
CPC .................................. H04B 3/56; H04B 3/54
USPC ......................................... 375/257, 256, 222
See application file for complete search history.

(56) References Cited

U.S. PATENT DOCUMENTS

| | | | |
|---|---|---|---|
| 7,453,895 B2 * | 11/2008 | Binder | 370/401 |
| 2010/0176968 A1 * | 7/2010 | White, II | 340/870.02 |
| 2012/0086517 A1 * | 4/2012 | Urabe | 333/17.3 |
| 2012/0201312 A1 * | 8/2012 | Schwager | 375/257 |

\* cited by examiner

*Primary Examiner* — Qutbuddin Ghulamali

(57) ABSTRACT

The present disclosure describes a device, system, and techniques for separating power line communication (PLC) signals, produced by a PLC modem, from AC mains power, which powers the PLC modem. In some aspects a universal PLC splitter is described that includes an AC mains power input with a line connection, a neutral connection, and a protective earth connection, and a filter coupling the line connection, the neutral connection, and the protective earth connection of the AC mains power input to a line connector, a neutral connector, and a protective earth connector of a socket. The filter suppresses the PLC signals on the AC mains power connections, and provides AC mains power to the socket to power the PLC modem under test. The PLC signals from the PLC modem are coupled to test signal ports for connection to test instruments.

20 Claims, 4 Drawing Sheets

METHOD AND APPARATUS FOR SEPARATING POWER LINE COMMUNICATION (PLC) SIGNALS FROM MAINS ELECTRICITY

CROSS REFERENCE TO RELATED APPLICATIONS

This application claims priority under 35 U.S.C. §119(e) to U.S. Provisional Patent Application Ser. No. 61/936,809 filed Feb. 6, 2014, the disclosure of which is incorporated by reference herein in its entirety.

BACKGROUND

Power line communication (PLC) modems provide data networking over AC power lines, taking advantage of existing power line wiring to carry radio frequency signals injected by the PLC modems on the power lines. In order to evaluate the performance of PLC modems and systems, as well as industry-standard and regulatory compliance, standardized test methods and equipment are required to provide consistent and accurate results when testing PLC modems from various vendors.

As PLC technologies evolve, different vendors introduce new approaches to PLC communication. PLC systems may be single channel or multiple channel systems. The PLC signals may be injected into different numbers or combinations of conductors of the power line wiring. A consistent and controlled environment is needed to evaluate the performance and operating characteristics of PLC modems and systems of varying designs.

SUMMARY

This summary is provided to introduce subject matter that is further described below in the Detailed Description and Drawings. Accordingly, this Summary should not be considered to describe essential features nor used to limit the scope of the claimed subject matter.

In general, in one aspect, this specification describes a device to separate PLC signals, produced by a PLC modem, from AC mains power, while presenting stable impedance and flat frequency response in the frequency band of interest. The device includes an AC mains power input comprising a line connection, a neutral connection, and a protective earth connection. The device also includes a socket to connect a PLC modem, and a filter coupling the line connection, the neutral connection, and the protective earth connection of the AC mains power input to respective line, neutral, and protective earth connectors of the socket. The device has coupling capacitors that each couple one of multiple test signal ports to a corresponding one of the line connector, the neutral connector, and the protective earth connector of the socket. The device also has resistors associated the multiple test signal ports, where each of the resistors is connected between a signal line of one of the multiple test signal ports and a reference potential that is connected to the protective earth connection of the AC mains power input.

In general, in another aspect, this specification describes a system for measuring power line communication (PLC) signals that includes a PLC modem configured to produce the PLC signals; and a PLC splitter connected to the PLC modem and configured to separate the PLC signals from AC mains power. The PLC splitter comprises an AC mains power input comprising a line connection, a neutral connection, and a protective earth connection, a socket to connect the PLC modem, and a filter coupling the line connection, the neutral connection, and the protective earth connection of the AC mains power input to a line connector, a neutral connector, and a protective earth connector of the socket. The PLC splitter further comprises coupling capacitors that each couple one of multiple test signal ports to a corresponding one of the line connector, the neutral connector, and the protective earth connector of the socket, and resistors associated with the multiple test signal ports, where each of the resistors is connected between a signal line of one of the multiple test signal ports and a reference potential that is connected to the protective earth connection of the AC mains power input.

In general, in another aspect, this specification describes a method of separating power line communication (PLC) signals from AC mains power, the method comprising, powering a PLC modem that produces the PLC signals, in a socket of a PLC splitter, from an AC mains power input comprising a line connection, a neutral connection, and a protective earth connection, and filtering a line connector, a neutral connector, and a protective earth connector of the socket to suppress the PLC signals conducted to the AC mains power input. The method further comprises capacitively-coupling the PLC signals from each of the line connector, the neutral connector, and the protective earth connector of the socket to a corresponding one of multiple test signal ports, and protecting each test signals port of the multiple test signal ports with a resistor that is associated the test signal port, the resistor connected between a signal line of the test signal port and a reference potential that is connected to the protective earth connection of the AC mains power input.

The details of one or more implementations are set forth in the accompanying drawings and the description below. Other features and advantages will be apparent from the description and drawings.

BRIEF DESCRIPTION OF THE DRAWINGS

In the figures, the left-most digit of a reference number identifies the figure in which the reference number first appears. The use of the same reference numbers in different instances in the description and the figures indicate like elements.

DETAILED DESCRIPTION

Figure 1A:
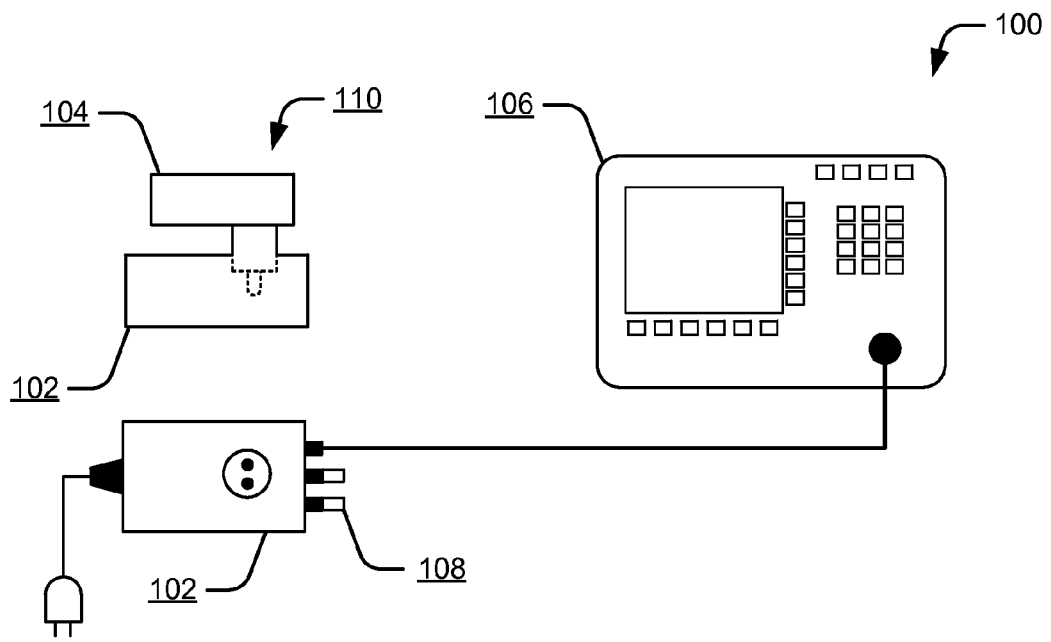
FIG. 1a illustrates an operating environment of a universal PLC splitter in accordance with one or more aspects.

Power line communication (PLC) modems provide data networking over AC power lines, taking advantage of existing power line wiring to carry radio frequency signals injected by the PLC modems on the power lines. In order to evaluate the performance of PLC modems and systems, as well as industry-standard and regulatory compliance standardized test methods and equipment are required to provide consistent and accurate results when testing PLC modems from various vendors. The various PLC systems use a variety of modulation and signal injection configurations for data communication. A test setup designed for one PLC system may not work, or provide accurate and comparable results, when used to evaluate hardware of a second PLC system. A test setup that works with the PLC systems and modems of all vendors is desirable to provide consistent and comparable measurements in a laboratory setting. The test setup provides an accurate benchmark of the PLC modems from various vendors before engaging in costly field-testing by telecom operators.

Many general-purpose test instruments, such as a spectrum analyzer, are readily available from test equipment vendors and can be used to measure the performance of PLC modems. However, connecting the test instruments to the PLC modem requires a PLC splitter to provide AC mains power to the PLC modem and couple the radio frequency PLC signals to the test instruments. For measurements to be accurate, the PLC splitter needs to provide high isolation to prevent PLC signal transmission from the PLC modem to the AC mains power. The PLC splitter must also prevent AC mains power, typically 110-220 volts AC at 50-60 Hertz, from reaching test signal ports that couple the PLC signals to the test instruments in order to prevent damage to the test instruments.

A universal PLC splitter can provide low insertion loss between the PLC modem and the test signal ports, as well as a relatively flat frequency response and consistent impedance between the conductors of the power line, to provide accurate measurements. As an example and not a limitation, typical PLC systems inject PLC signals in the range of 2 to 86 MHz, although wider frequency ranges, for example up to 250 MHz, are contemplated. The frequency response of the universal PLC splitter is implemented to be flat over the operating frequency range of the PLC system. The filtering in the PLC splitter that prevents PLC signal transmission to the AC mains power can exhibit resonances that affect the frequency response of the PLC splitter.

For example, a low-pass, inductor-capacitor filter (LC-filter) may provide isolation from the PLC signals to the AC mains power, but the LC-filter may have a relatively high quality factor (Q) that results in variations in the frequency response of the PLC splitter and in the impedance seen from the PLC modem. These variations in frequency response lead to inaccuracies in frequency-dependent measurements, such as power spectral density.

An AC mains power outlet typically has three conductors, a line conductor, a neutral conductor, and a protective earth (or ground) conductor. The universal PLC splitter places the same circuit elements on the line connection, the neutral connection, and the protective earth connection, to provide the same common-mode impedance on the three connections. For example, various PLC systems differentially inject signals on different numbers or combinations of these conductors. A one channel, Single-In, Single-Out (SISO) PLC system may only inject a PLC signal across the line and neutral. Other PLC systems may support more than a single channel, using Multiple-In, Multiple-Out (MIMO) signal injection and reception across a larger number and combination of conductors to provide more data throughput than a SISO PLC system. For example, a MIMO PLC system may inject the PLC signal for a second channel across the line and the protective earth conductors, the neutral and the protective earth conductors, or the line and neutral conductors in parallel and the protective earth conductor, and so forth. Regardless of the signal injection configuration, the universal PLC splitter exhibits the same high frequency behavior and impedance on the line, the neutral, and the protective earth connections, for PLC signals produced by any PLC system.

By way of further example, the same common-mode impedance on the three connections of the universal PLC splitter enables testing a PLC modem that is embedded in another device, such as a television, a washing machine, and so forth. The device containing the embedded PLC modem is connected to the universal PLC splitter. For example, when the PLC modem is embedded in a washing machine, there are other electrical components in the washing machine that may affect propagation of the PLC signals from the PLC modem to the AC mains power input of the washing machine. The common-mode impedance characteristics of the universal PLC splitter enable measurement of the effects of impedance variations of the different electrical paths in the washing machine on the PLC signals.

The universal PLC splitter provides high isolation of PLC signals from the AC mains power input to test PLC systems with high dynamic ranges. By way of example and not limitation, dynamic ranges up to 100 dB or greater can be tested using the universal PLC splitter.

The universal PLC splitter couples the PLC signals from the line, the neutral, and the protective earth conductors to respective test signal ports that are referenced to a common reference potential. The same common-mode impedance on the three connections of the universal PLC splitter combined with referencing each of the line, the neutral, and the protective earth conductors to the reference potential enables accurate measurements to be made on each individual conductor when using the universal PLC splitter.

The universal PLC splitter capacitively couples the PLC signals to the test signal ports to provide a low insertion loss for accurate power measurements. By way of example and not limitation, the universal PLC splitter has an insertion loss of less than 0.5 dB. The low insertion loss of the universal PLC splitter enables many measurements to be made without using calibration to compensate for losses in the PLC splitter.

The following discussion describes an operating environment, and techniques that may be employed in the operating environment. In the discussion below, reference is made to the operating environment by way of example only.

Operating Environment

FIG. 1a illustrates an example operating environment 100 having a universal PLC splitter 102 that provides power to a PLC modem 104 and couples PLC signals from the PLC modem 104 to test equipment 106. The PLC modem 104 is connected to the universal PLC splitter 102 (as shown in side view at 110) for testing of the PLC modem 104. The universal PLC splitter 102 couples a PLC signal for each power line conductor (line, neutral and protective earth) to the test equipment 106. When only a single PLC signal from a single conductor is measured, the unused test signal ports may be terminated using terminators 108. The terminators 108 are typically 50-ohm terminators, which match the characteristic input impedance of the test equipment 106; however, terminators of other values are contemplated. Also, as is well known, a multiplexing switch can be inserted between the universal PLC splitter 102 and the test equipment 106, such as for automated testing, to connect the test equipment 106 to each of the test signal ports, in turn, to measure PLC signals at each test signal port.

Figure 1B:
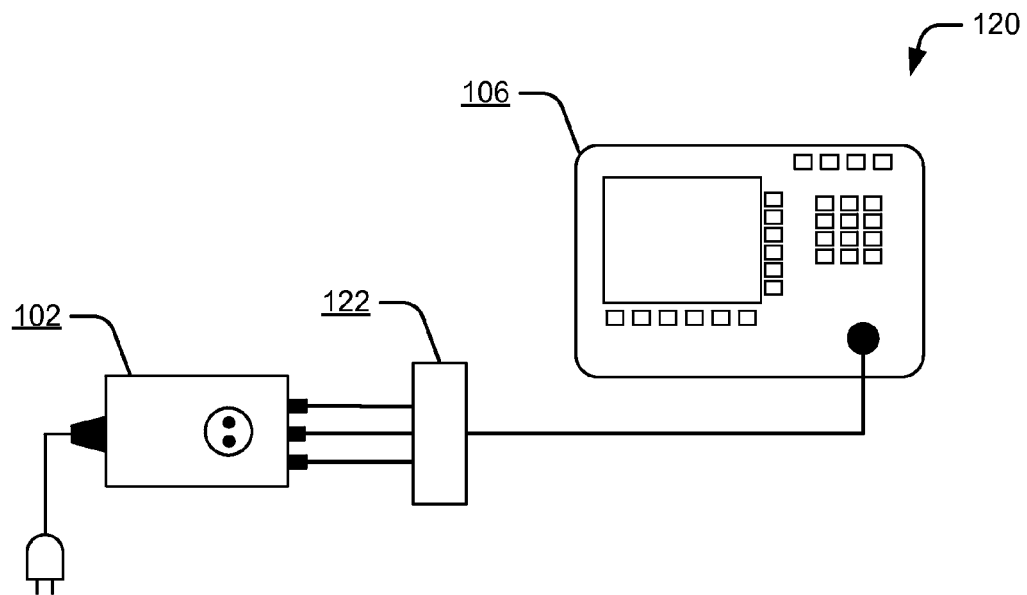
FIG. 1b illustrates another operating environment of the universal PLC splitter in accordance with one or more aspects.

FIG. 1b illustrates an example operating environment 120 having the universal PLC splitter 102 connected to a combiner 122. The output of the combiner 122 is connected to the test equipment 106. Common-mode measurements are made by combining the PLC signals from the three test signal ports with the combiner 122 to detect if there is common-mode transmission by the PLC modem 104 under test.

Figure 1C:
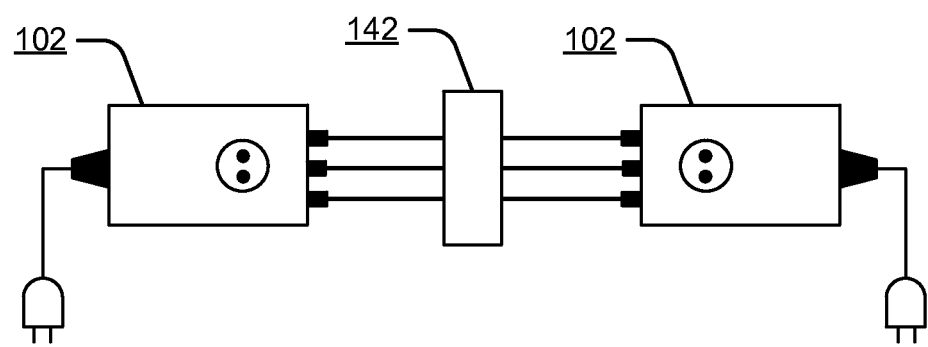
FIG. 1c illustrates another operating environment of the universal PLC splitter in accordance with one or more aspects.

FIG. 1c illustrates an example operating environment 140 having a first universal PLC splitter 102 connected through a triple attenuator 142 to a second universal PLC splitter 102. The triple attenuator 142 comprises three variable attenuators, one each for the line, the neutral, and the protective earth connections. Using this configuration of the universal PLC splitters 102 and the triple attenuator 142, the dynamic range of the PLC system can be determined. When two universal PLC splitters 102 are connected together, as shown in FIG. 1c, isolation in excess of 120 dB, between two PLC modems 104 under test, is available for dynamic range testing. Isolation from conducted signals is provided by filtering in the universal PLC splitter 102 and the shielding of the chassis of the universal PLC splitter 102 provides isolation from radiated signals. Without sufficient isolation in a PLC splitter, signals can radiate around an attenuator and reduce the accuracy of the dynamic range measurement.

Figure 2:
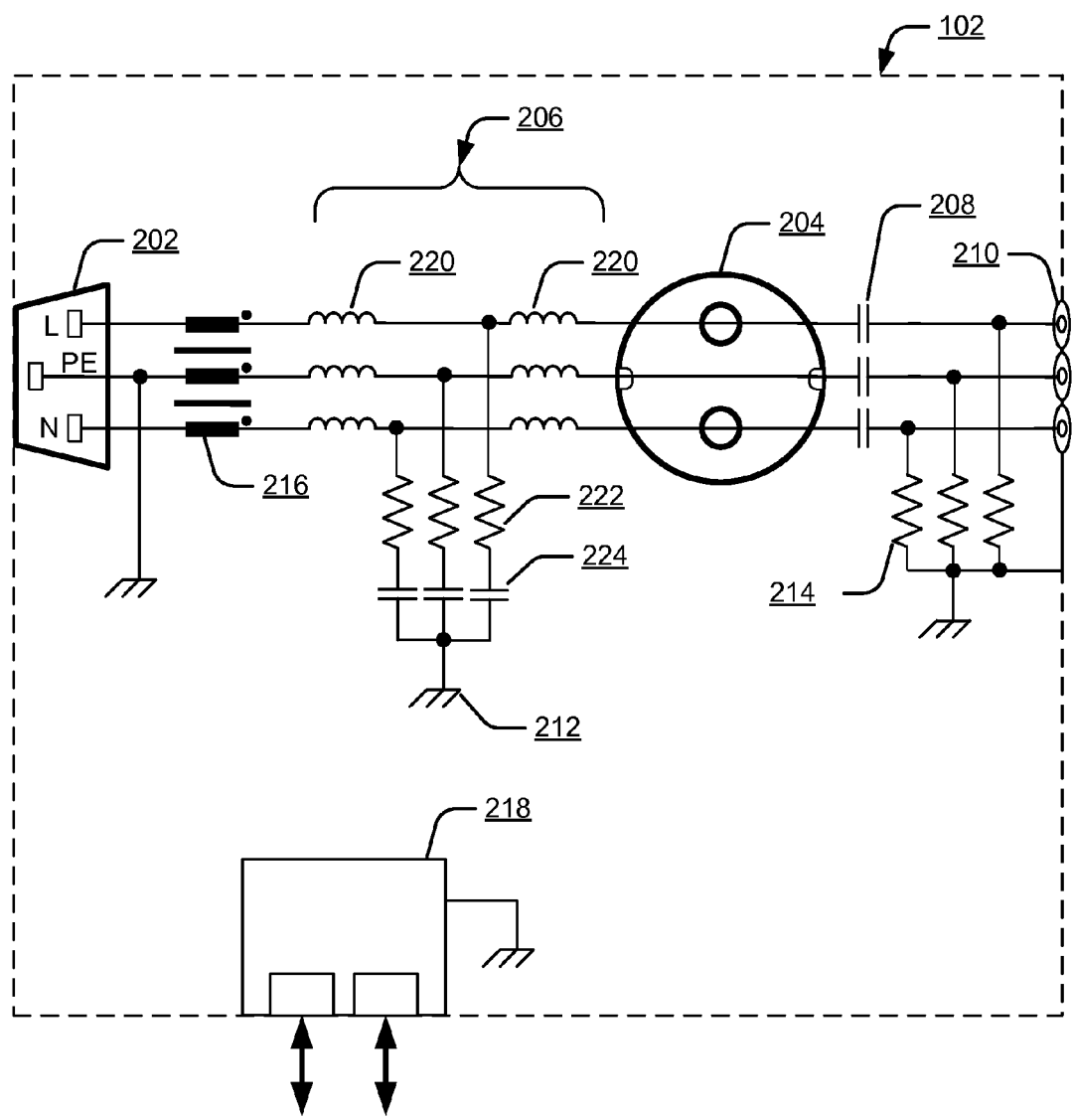
FIG. 2 illustrates an example device diagram of the universal PLC splitter in accordance with one or more aspects.

FIG. 2 illustrates an example of a device diagram 200 of the universal PLC splitter 102. AC mains power is applied to the universal PLC splitter 102 at an AC mains power input 202. The AC mains power input 202 comprises connections for line, neutral, and protective earth (ground) conductors of the AC mains power. The AC mains power input 202 may use any suitable connection, such as a hardwired power cord, an IEC chassis plug, and so forth, to connect to the AC mains power.

The PLC modem 104 connects to the universal PLC splitter 102 at a socket 204. The socket 204 comprises connectors for the line, the neutral, and the protective earth conductors of the AC mains power. The socket 204 may be of any suitable type with line, neutral and protective earth connectors, such as a NEMA 5-15 socket, a BS 1363 socket, a CEE 7 socket, and so forth.

The socket 204 is connected to the AC mains power input 202 by a filter 206. The filter 206 isolates the PLC signals produced by the PLC modem 104 from the AC mains power while coupling the AC mains power from the AC mains power input 202 to the socket 204. The filter 206 is a low-pass filter, which is described in detail below.

The PLC signals from the PLC modem 104 are injected on one or more of the line, the neutral, and the protective earth connectors of the socket 204. The PLC signals are coupled from the connectors of the socket 204, by coupling capacitors 208, to test signal ports 210. The coupling capacitors 208 can be of any suitable value to couple the PLC signals to the test signal ports 210. The coupling capacitors 208 also provide electrical protection to reduce AC mains current flowing to the test signal ports 210, which provides electrical safety that complies with the regulations of various countries. As an example and not a limitation, the coupling capacitors 208 for a PLC system with a frequency range of 2 to 80 MHZ frequency range are 6.8 nF capacitors. The test signal ports 210 are typically coaxial connectors suitable for connection to the test equipment 106.

The connectors for the test signal ports 210 may be of any suitable type, for example BNC, SMA, Type-N, and so forth. Typically, the connectors have a nominal impedance of 50 ohms, although connectors of any suitable impedance may be used. Each of the PLC signals, coupled thorough the coupling capacitors 208, is coupled to a center (signal) pin of a respective coaxial connector of the test signal ports 210. The outer (shield) of each connector of the test signal ports 210 is connected to a reference potential 212 of the universal PLC splitter 102. The impedance at each of the test signal ports 210 can be specified with respect to the reference potential 212.

The PLC signals are measured by the test equipment 106 with respect to the reference potential 212. The reference potential 212 is typically the chassis of the universal PLC splitter 102. The chassis is conductive, typically metal, and provides the reference potential 212 for the PLC signals in the universal PLC splitter 102 and the connected test equipment 106. The reference potential 212 is connected to the protective earth connection of the AC mains power input 202. The chassis may also be in contact with a metal reference plane that extends under the chassis of the universal PLC splitter 102 and is connected to the ground reference of the test equipment 106.

The chassis typically encloses all the components of the universal PLC splitter 102 to shield the components from external, radiated RF signals. The chassis also prevents the PLC signals in the universal PLC splitter 102 from radiating outside the universal PLC splitter 102, so that the PLC signals do not leak into other components of a test setup, creating measurement inaccuracies. Further isolation for test setups using multiple universal PLC splitters 102 may be achieved by placing the multiple universal PLC splitters 102 on, or connecting the multiple universal PLC splitters 102 to, a conductive surface, for example a metal table top.

To protect users of, or test equipment connected to, the universal PLC splitter 102 from the voltages of the AC mains power; protection resistors 214 are connected between the signal pin of each of the connectors of the test signal ports 210 and the reference potential 212. The protection resistors 214 shunt the line voltage of the AC mains power to the reference potential 212 when the test signal ports 210 are unterminated, such that the line voltage of the AC mains power is near zero volts at the test signal ports 210 while not affecting the PLC signals. For example, the protection resistors 214 have a value of 10 kilohms, although other values are contemplated. The coupling capacitors 208 and the protection resistors 214, which together can also be regarded as a high-pass filter, protect users from exposure to dangerous AC mains current and AC mains voltage, respectively, without affecting the RF signals.

To further suppress transmission, particularly common-mode transmission, of the PLC signals to the AC mains power, a three-wire choke 216 may optionally be connected between the AC mains power input 202 and the filter 206. The three-wire choke 216 suppresses common-mode PLC signals remaining after filtering by the filter 206. The three-wire choke 216 may be of any suitable type, such as ferrite beads, wire-wound chokes with ferrite cores, and so forth. As an example and not a limitation, the three-wire choke 216 may be constructed with three twisted wires on a torus to filter the RF signals.

The PLC modem 104 may include a wired network port, such as an Ethernet port. The PLC signals in the PLC modem 104 may leak onto the conductors of the Ethernet port and be conducted and/or radiated by an Ethernet cable connected between the PLC modem 104 and a computing device, such as a personal computer, or a data traffic generator, and the like. To reduce signal leakage or transmission that can affect dynamic range tests, the universal PLC splitter 102 includes an Ethernet filter 218. The Ethernet filter 218 is connected to the reference potential 212 and includes two ports, a first port for an Ethernet connection to the PLC modem 104, and a second port for connection to the computing device. The connectors of the Ethernet filter 218 include common-mode chokes and transformers for each pair of conductors. The transformers are center-tapped, with the center-tapped connection of the transformer being tied to the shield of the Ethernet connector and the reference potential 212 to prevent common-mode transmission of the PLC signals.

Turning again to the filter 206, a typical LC-filter with a pi capacitor may provide a high quality factor (Q) filter, but with the tradeoff of strong resonances and/or parasitics that produce an uneven frequency response and/or impedance variations in the PLC splitter. To produce a flatter frequency response in the universal PLC splitter 102, the filter 206 filters the line, the neutral, and the protective earth connections using a filter with a star configuration from each connection of the line, the neutral, and the protective earth connections to the reference potential 212. For each of the line, the neutral, and the protective earth connections, the filter 206 comprises two inductors 220 connected in series and connected between the AC mains power input 202 and the socket 204. (Note that for clarity, reference designators are shown in FIG. 2 for the line connection, but the illustrated designators apply similarly to all three connections.) A first end of a resistor 222 is connected to the junction between the two series inductors 220 and a second end of the resistor 222 is connected to a first connection of a capacitor 224. The second connection of the capacitor 224 is connected to the reference potential 212.

The filter 206 filters the line, the neutral, and the protective earth connections of the AC mains power with respect to the reference potential 212, so that the frequency and impedance characteristics are consistent for the PLC signals on the line, the neutral, and the protective earth connections. The resistor 222 reduces the Q of the filter 206, which in turn provides a flatter frequency and low impedance variations for more accurate results for frequency-dependent measurements, such as power spectral density.

By way of example and not limitation, for PLC systems operating over a frequency range of 2 to 86 MHZ, the inductors 220 have a typical inductance of 56 microHenrys, the resistors 222 have a typical resistance of 100 ohms, and the capacitors 224 have a typical capacitance of 4.7 nF. Other values are contemplated. Additionally, the values of the two inductors 220 in the filter 206 may be chosen to be different from each other, based on components characteristics of the inductors 220, to achieve the desired filtering characteristics.

By placing the same circuit elements on the line, the neutral, and the protective earth connections, there is the same common-mode impedance on the three connections so that high frequency behavior of the universal PLC splitter 102 is the same for SISO and/or MIMO PLC signals from any of the various PLC systems. A highly symmetric layout of the components of the filter 206 in the universal PLC splitter 102 minimizes mode conversion, from differential-mode to common-mode along the filter.

The universal PLC splitter 102 provides a 50 ohm impedance at the test signal ports 210 and a 100-ohm differentially-ended impedance at the AC mains input 202 as specified in the EN-50561 standard. The universal PLC splitter 102 has a low insertion loss for PLC signals from the PLC modem 104 to connected test equipment 106, for example less than 0.5 dB of insertion loss.

Techniques for the Universal PLC Splitter

The following discussion describes techniques for the universal PLC splitter. These techniques can be implemented using the previously described environments or entities, such as the testing environments of FIGS. 1a, 1b, and/or 1c. These techniques include the method illustrated in FIG. 3, which is shown as a set of operations performed by one or more entities. These methods are not necessarily limited to the order shown for performing the operations. Further, this method may be used in whole or in part, whether performed by the same entity, separate entities, or any combination thereof. In portions of the following discussion, reference will be made to operating environments 100, 120, and 140 of FIGS. 1a, 1b, and 1c, as well as entities of device environment 200 of FIG. 2 by way of example. Such reference is not to be taken as limited to operating environments 100, 120, and 140 but rather as illustrative of one of a variety of examples.

Figure 3:
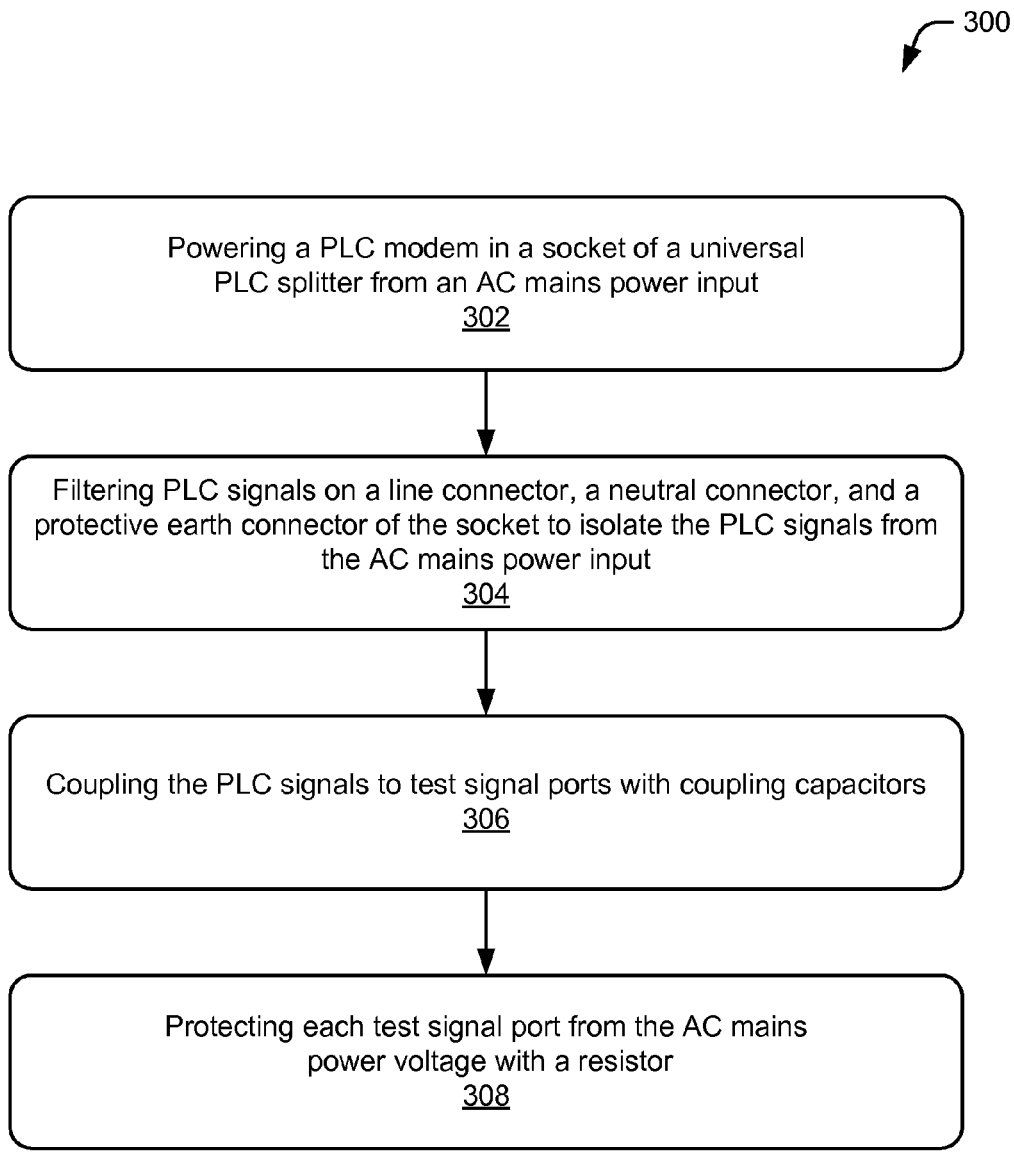
FIG. 3 illustrates a method of using the universal PLC splitter in accordance with one or more aspects.

FIG. 3 depicts a method 300 of separating one or more PLC signals from AC mains power, including operations performed by the universal PLC splitter 102 of FIG. 2. At 302, AC mains power is provided to a socket that connects to a PLC modem that produces PLC signals. For example, the AC mains power input 202 of the universal PLC splitter 102 is connected to the socket 204 of the universal PLC splitter 102 to provide AC mains power to the PLC modem 104.

At 304, the PLC signals produced by the PLC modem are filtered for line, neutral and protective earth connectors of the socket to isolate the PLC signals from an AC mains power input. For example, the filter 206 is connected between the AC mains power input 202 and the socket 204 to separate the PLC signals produced by the PLC modem 104 from the AC mains power input 102.

At 306, the PLC signals are coupled to test signal ports. For example, the PLC signals from each of the line, the neutral, and the protective earth connectors of the socket 204 are coupled by the coupling capacitors 208 to a corresponding one of the test signal ports 210.

At 308, the test signal ports are protected to eliminate AC mains power voltage on the test signal ports. For example, one of the protection resistors 214 is connected from the signal line of the connector of each test signal port 210 to the reference potential 212 to shunt the AC mains power to the reference potential 212.

Although the subject matter has been described in language specific to structural features and/or methodological operations, it is to be understood that the subject matter defined in the appended claims is not necessarily limited to the specific features or operations described above, including orders in which they are performed.

What is claimed is:

1. A power line communication (PLC) splitter to separate PLC signals from AC mains power, the PLC splitter comprising:
    an AC mains power input comprising a line connection, a neutral connection, and a protective earth connection;
    a socket to connect a PLC modem;
    a filter respectively coupling the line connection, the neutral connection, and the protective earth connection of the AC mains power input to a line connector, a neutral connector, and a protective earth connector of the socket;
    a plurality of capacitors, wherein each capacitor of the plurality of capacitors respectively couples one of multiple test signal ports to a corresponding one of the line connector, the neutral connector, and the protective earth connector of the socket; and
    a plurality of resistors being used to reduce a Q factor of the filter such that the frequency response of the PLC splitter is flat over an operating frequency range of the PLC splitter, wherein each resistor of the plurality of resistors is respectively associated with one of the multiple test signal ports, and wherein each resistor of the plurality of resistors is connected between
        (i) a signal line of a test signal port, and
        (ii) a reference potential that is connected to the protective earth connection of the AC mains power input.

2. The PLC splitter of claim 1, wherein for each of the line connection, the neutral connection, and the protective earth connection of the AC mains power input, the filter comprising:

two inductors connected in series between the AC mains power input connection and a corresponding socket connector; and a resistor connected between the two series inductors and a capacitor that is connected to the reference potential.

3. The PLC splitter of claim 1, wherein the filter separates the PLC signals produced by the PLC modem from the AC power input of the PLC splitter.

4. The PLC splitter of claim 1, further comprising a three-wire choke connected between the AC mains power input and the filter, the three-wire choke being effective to reduce transmission of the PLC signals to the AC mains power input.

5. The PLC splitter of claim 1, further comprising a chassis that is conductive and electrically connected to the protective earth connection of the AC mains power input, and wherein the chassis is the reference potential of the PLC splitter.

6. The PLC splitter of claim 1, further comprising an Ethernet filter connected to the reference potential, the Ethernet filter configured to filter signal lines of an Ethernet connection, between the PLC modem and a computing device, to reduce transmission of the PLC signals on the Ethernet connection.

7. The PLC splitter of claim 1, wherein the plurality of resistors cause the frequency response of the PLC splitter to be flat over an operating frequency range of the PLC splitter responsive to reducing the Q factor of the filter.

8. A system for measuring power line communication (PLC) signals, the system comprising:
a PLC modem configured to produce the PLC signals; and
a PLC splitter connected to the PLC modem and configured to separate the PLC signals from AC mains power, the PLC splitter comprising:
an AC mains power input comprising a line connection, a neutral connection, and a protective earth connection;
a socket to connect the PLC modem;
a filter respectively coupling the line connection, the neutral connection, and the protective earth connection of the AC mains power input to a line connector, a neutral connector, and a protective earth connector of the socket;
a plurality of coupling capacitors wherein each capacitor of the plurality of capacitors respectively couples one of multiple test signal ports to a corresponding one of the line connector, the neutral connector, and the protective earth connector of the socket; and
a plurality of resistors being used to reduce a Q factor of the filter such that the frequency response of the PLC splitter is flat over an operating frequency range of the PLC splitter, wherein each resistor of the plurality of resistors is respectively associated with one of the multiple test signal ports, and wherein each resistor of the plurality of resistors is connected between
(i) a signal line of a test signal port, and
(ii) a reference potential that is connected to the protective earth connection of the AC mains power input.

9. The system of claim 8, wherein for each of the line connection, the neutral connection, and the protective earth connection of the AC mains power input, the filter of the PLC splitter comprises:
two inductors connected in series between the AC mains power input connection and a corresponding socket connector; and
a resistor connected between the two series inductors and a capacitor that is connected to the reference potential.

10. The system of claim 8, wherein the filter separates the PLC signals produced by the PLC modem from the AC power input of the PLC splitter.

11. The system of claim 10, wherein the PLC splitter further comprises a three-wire choke connected between the AC mains power input and the filter, the three-wire choke being effective to reduce transmission of the PLC signals to the AC mains power input.

12. The system of claim 8, wherein the PLC splitter further comprises a chassis that is conductive and electrically connected to the protective earth connection of the AC mains power input, and wherein the chassis is the reference potential of the PLC splitter.

13. The system of claim 8, further comprising:
a computing device; and
the PLC splitter further comprising an Ethernet filter connected to the reference potential, the Ethernet filter configured to filter signal lines of an Ethernet connection, between the PLC modem and the computing device, to reduce transmission of the PLC signals on the Ethernet connection.

14. The system of claim 8, wherein the plurality of resistors cause the frequency response of the PLC splitter to be flat over an operating frequency range of the PLC splitter responsive to reducing the Q factor of the filter.

15. A method of separating power line communication (PLC) signals from AC mains power, the method comprising:
powering a PLC modem that produces the PLC signals, the PLC modem connected via a socket of a PLC splitter to an AC mains power input comprising a line connection, a neutral connection, and a protective earth connection;
filtering a line connector, a neutral connector, and a protective earth connector of the socket to separate the PLC signals from the AC mains power input;
capacitively-coupling the PLC signals from each of the line connector, the neutral connector, and the protective earth connector of the socket to a corresponding one of multiple test signal ports;
protecting each test signal port of the multiple test signal posts with a resistor that is associated with the test signal port, the resistor connected between
(i) a signal line of a test signal port, and
(ii) a reference potential that is connected to the protective earth connection of the AC mains power input; and
separating the PLC signals from the AC mains power input such that the frequency response of the PLC splitter is flat over an operating frequency range of the PLC splitter.

16. The method of claim 15, wherein for each of the line connection, the neutral connection, and the protective earth connection of the AC mains power input, the filtering is performed by a filter comprising:
two inductors connected in series between the AC mains power input connection and a corresponding socket connector;
a capacitor that is connected to the reference potential; and
a resistor connected between the two series inductors and to the capacitor.

17. The method of claim 16, further comprising:
suppressing the PLC signals at the AC mains power input with a three-wire choke connected between the AC mains power input and the filter.

18. The method of claim 15, wherein the PLC splitter further comprises a chassis that is conductive and electrically connected to the protective earth connection of the AC mains power input, and wherein the chassis is the reference potential.

19. The method of claim 15, further comprising reducing transmission of the PLC signals on an Ethernet connection, between the PLC modem and a computing device, with an Ethernet filter connected to the reference potential, the Ethernet filter configured to filter signal lines of the Ethernet connection, between the PLC modem and the computing device.

20. The method of claim 15, wherein the frequency response of the PLC splitter is caused to be flat over the operating frequency range of the PLC splitter responsive to a reduction in a Q factor of the filter.

* * * * *